United States Patent [19]
Brown et al.

[11] Patent Number: 6,100,143
[45] Date of Patent: Aug. 8, 2000

[54] METHOD OF MAKING A DEPLETED POLY-SILICON EDGED MOSFET STRUCTURE

[75] Inventors: Jeffrey S. Brown, Middlesex; Robert J. Gauthier, Jr., Hinesburg; Steven H. Voldman, South Burlington, all of Vt.

[73] Assignee: International Business Machines Corporation, Armonk, N.Y.

[21] Appl. No.: 09/267,239

[22] Filed: Mar. 12, 1999

Related U.S. Application Data

[62] Division of application No. 09/157,003, Sep. 18, 1998, Pat. No. 5,998,848.

[51] Int. Cl.$^7$ ................................................ H01L 21/336
[52] U.S. Cl. .................... 438/296; 438/221; 438/532; 438/919
[58] Field of Search .................. 438/221, 296, 438/532, 919

[56] References Cited

U.S. PATENT DOCUMENTS

| | | |
|---|---|---|
| 4,183,040 | 1/1980 | Rideout . |
| 4,287,661 | 9/1981 | Stoffel . |
| 4,784,965 | 11/1988 | Woo et al. . |
| 4,811,066 | 3/1989 | Pfietser et al. . |
| 5,108,940 | 4/1992 | Williams . |
| 5,212,542 | 5/1993 | Okumura . |
| 5,252,848 | 10/1993 | Adler et al. . |
| 5,275,961 | 1/1994 | Smayling et al. . |
| 5,352,914 | 10/1994 | Farb . |
| 5,387,540 | 2/1995 | Poon et al. . |
| 5,401,994 | 3/1995 | Adan . |
| 5,426,327 | 6/1995 | Murai . |
| 5,436,488 | 7/1995 | Poon et al. . |
| 5,480,830 | 1/1996 | Liao et al. . |
| 5,498,566 | 3/1996 | Lee . |
| 5,521,422 | 5/1996 | Mandelman et al. . |
| 5,523,603 | 6/1996 | Fishbein et al. . |
| 5,567,553 | 10/1996 | Hsu et al. . |
| 5,578,518 | 11/1996 | Koike et al. . |
| 5,637,903 | 6/1997 | Liao et al. . |
| 5,646,052 | 7/1997 | Lee . |
| 5,648,668 | 7/1997 | Kasai . |
| 5,674,775 | 10/1997 | Ho et al. . |

FOREIGN PATENT DOCUMENTS

| | | |
|---|---|---|
| 62-094984 | 5/1987 | Japan . |
| 1-232765 | 9/1989 | Japan . |
| 2-137372 | 5/1990 | Japan . |
| 6-061482 | 3/1994 | Japan . |
| 6-151828 | 5/1994 | Japan . |
| 1-264265 | 10/1998 | Japan . |

*Primary Examiner*—George Fourson
*Assistant Examiner*—Joannie A. Garcia
*Attorney, Agent, or Firm*—DeLio & Peterson LLC; Peter W. Peterson; Eugene I. Shkurko

[57] ABSTRACT

A field effect transistor with reduced corner device problems comprises source and drain regions formed in a substrate, a channel region between the source and drain regions, isolation regions in the substrate adjacent the source, channel and drain regions; and a gate having a gate dopant over the channel region and separated therefrom by a gate dielectric. The isolation regions define corner regions of the channel along interfaces between the channel and isolation regions. The gate includes regions depleted of the gate dopant and overlapping at least the channel region and the isolation regions, such that voltage thresholds of the channel corner regions beneath depleted portions of the gate conductor layer are increased compared to regions of the channel between the corner regions.

The field effect transistor with reduced dopant concentration on the MOSFET gate "corner" has an improved edge voltage tolerance. The structure has improved edge dielectric breakdown and lower MOSFET gate-induced drain leakage (GIDL). This structure is intended for analog applications, mixed voltage tolerant circuits and electrostatic (ESD) networks.

20 Claims, 10 Drawing Sheets

METHOD OF MAKING A DEPLETED POLY-SILICON EDGED MOSFET STRUCTURE

This is a divisional of application Ser. No. 09/157,003 filed on Sep. 18, 1998 now U.S. Pat. No. 5,998,848.

BACKGROUND OF THE INVENTION

1. Field of the Invention

This invention relates to semiconductor structures, and in particular to field effect transistor (FET) devices incorporating depleted zones in the gate conductor along the corner region of the FET to increase the threshold voltage of the corner device.

2. Description of Related Art

Contemporary CMOS devices employ field effect transistors (FET) which are adjacent to or bounded by trenches such as shallow trench isolation (STI). As the widths of these devices are made smaller, unwanted effects originating at the corner device i.e., the channel region under gate conductor at the corners of the trenches, become more significant. It has been found that the electric field in the gate conductor near the trench corner may become enhanced, which leads to a reduction of the threshold voltage of the channel in that region, compared to the threshold voltage of the channel under the planar portion of the gate away from the corner. This lower threshold voltage provides a parallel path for current conduction which has different turn-on characteristics and adversely affects the performance of the device.

Attempts have been made to solve this problem in various ways, for example, reducing STI pull down, increasing the corner rounding at the edges of the STI as described in U.S. Pat. Nos. 5,578,518 and 5,674,775, or increasing oxide thickness over the corner region as described in U.S. Pat. Nos. 5,387,540 and 5,436,488. While such techniques have been found to reduce the threshold voltage of the corner device, they provide other problems such as increasing the complexity of manufacturing requirements or requiring an undesirable increase in the thickness of layers. Some of the prior art techniques have caused an increase in voltage threshold away from the corners as well.

Accordingly, a need exists for a semiconductor structure which increases threshold voltage at isolation corners which may be fabricated with improved reliability and fewer performance problems.

Bearing in mind the problems and deficiencies of the prior art, it is therefore an object of the present invention to provide a structure and method for increasing threshold voltage near the corner of isolation regions in a semiconductor structure, particularly FETs.

It is another object of the present invention to provide a method and system which reduces the complexity of prior manufacturing methods for increasing threshold voltage in a corner device.

A further object of the present invention is to provide a method and system which makes modeling of a field effect transistor simpler and more reliable.

Another object of the present invention is to provide a more voltage tolerant semiconductor structure to be used for mixed-voltage peripheral input/output circuitry, analog applications and electrostatic discharge (ESD) applications.

Yet another object of the present invention is to provide a structure which is more tolerant to electrical overstress (EOS) and ESD.

SUMMARY OF THE INVENTION

The above and other objects and advantages, which will be apparent to one of skill in the art, are achieved in the present invention which is directed to, in a first aspect, a field effect transistor comprising source and drain regions formed in a substrate, a channel region between the source and drain regions and isolation regions in the substrate adjacent the source, channel and drain regions. The transistor includes a gate having a gate dopant over the channel region and separated therefrom by a gate dielectric. The gate includes regions depleted of the gate dopant and overlapping at least the channel region and the isolation regions.

The depleted regions may be counterdoped to the gate dopant over the dielectric layer. For example, the dopant in the gate may be a p-type dopant and the depleted regions are counterdoped with an n-type dopant, or the dopant in the gate may be an n-type dopant and the depleted regions are counterdoped with a p-type dopant.

In another aspect, the present invention relates to a semiconductor structure comprising a substrate, a channel region in the substrate. Isolation regions are formed in the substrate on opposite sides of the channel region, the isolation regions defining corner regions of the channel along interfaces between the channel and isolation regions. A dielectric layer is disposed over the channel region between the isolation regions. A gate conductor layer is disposed over the dielectric layer between the isolation regions. The gate conductor layer contains a dopant to increase the electrical conductivity thereof, with portions of the gate conductor layer above the corner regions of the channel being depleted of the dopant to increase the resistivity thereof.

The structure may further include source and drain regions between the isolation regions on opposite sides of the channel region, such that the structure forms a field effect transistor. Voltage thresholds of the channel corner regions beneath depleted portions of the gate conductor layer are increased compared to regions of the channel between the corner regions. The gate conductor may be doped with an n- or p-type dopant and the depleted regions may be counter-doped to the gate dopant and overlap at least the channel region and the isolation regions.

Preferably, the depleted regions extend from the dielectric layer to an upper surface of the gate. The gate may comprise a layer of silicon containing the dopant and the dopant-depleted regions, and a metal silicide layer may be deposited over the silicon layer, including the dopant-depleted regions.

In yet another aspect, the present invention provides a method of making a field effect transistor semiconductor structure. The method includes the steps of providing a semiconductor substrate, forming isolation regions in the substrate to define a channel region, and forming a gate over the channel and isolation regions. The gate contains a dopant to increase the electrical conductivity thereof between the isolation regions except for portions of the gate over regions of interface between the channel and the isolation regions.

The method may further include forming a dielectric layer over the channel region prior to forming the gate and forming source and drain regions in the substrate within the isolation regions on either side of the channel region.

A further aspect of the invention provides a method of making a field effect transistor semiconductor structure comprising the steps of providing a semiconductor substrate, forming isolation regions in the substrate to define a channel region, and forming a gate over the channel and isolation regions. The gate contains a dopant to increase the electrical conductivity thereof between the isolation regions. The method includes the step of counterdoping the gate over regions of interface between the channel and the isolation regions to decrease the electrical conductivity compared to portions of the gate between the interface regions.

Another aspect of the present invention relates to a method of making a semiconductor structure. The method comprises initially providing a semiconductor structure having a substrate, a channel region in the substrate, isolation regions formed in the substrate on opposite sides of the channel region, the isolation regions defining corner regions of the channel along interfaces between the channel and isolation regions, a dielectric layer over the channel region between the isolation regions, and a gate conductor layer having an n- or p-type dopant over the dielectric layer between the isolation regions. The method includes depleting portions of the gate conductor layer above the corner regions of the n- or p-type dopant. The depleted portions of the gate conductor display increased resistivity compared to the remaining portions of the gate conductor layer over the channel region.

The depleting step may be performed by masking the portions of the gate conductor layer above the corner regions to restrict diffusion of the dopant. Alternatively, the depleting step may be performed by counterdoping the portions of the gate conductor layer above the corner regions with a different dopant.

Where the corner regions are counterdoped, the method may further include the step of forming extension implants in the substrate within the isolation regions and on either side of the gate. The depleting step may be performed by counterdoping the portions of the gate conductor layer above the corner regions with a different dopant after forming the extension implants. Similarly, the counterdoping method may further include the step of forming source and drain implants in the substrate within the isolation regions and on either side of the gate, and the depleting step may be by counterdoping the portions of the gate conductor layer above the corner regions with a different dopant after forming the source and drain implants.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
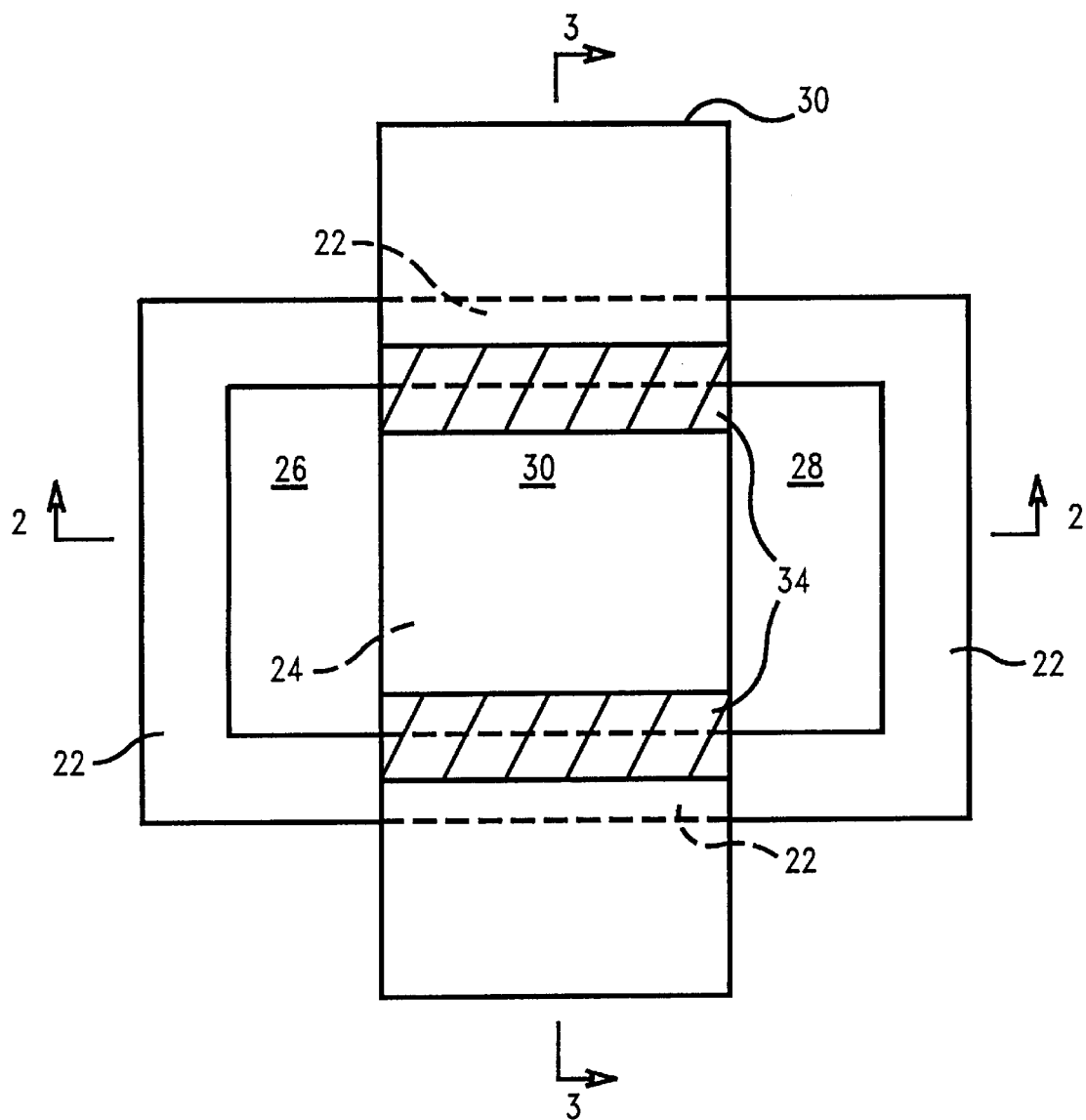
FIG. 1 is a top plan view of the preferred field effect transistor made in accordance with the present invention showing the dopant depleted regions of the gate conductor layer.
Figure 2:
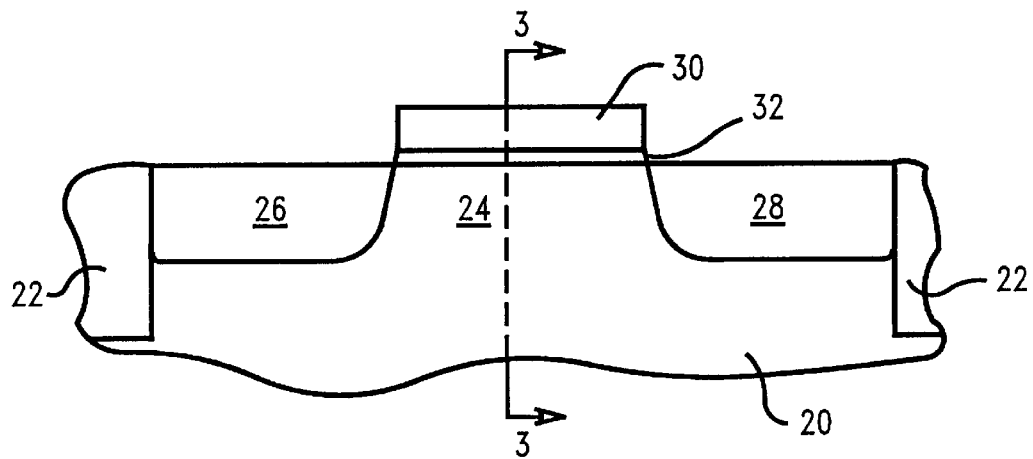
FIG. 2 is a vertical cross-sectional view of the field effect transistor of FIG. 1 along the length of the channel (line 2—2 of FIG. 1).

The preferred embodiments of the semiconductor structure for use in making a field effect transistor are shown in FIGS. 1–16. The preferred structure of the present invention forms in a substrate 20 opposing pairs of shallow trench isolation or other isolation structures 22 which are inset at a desired distance below the surface of substrate 20. Substrate 20 may be any conventional semiconductor substrate such as bulk silicon or silicon-on-insulator (SOI). The portion of semiconductor substrate between the STI 22 trenches includes the channel region of the FET. Channel region 24 separates, on opposite sides thereof, source region 26 and drain region 28, also formed in substrate 20 and within the boundaries of STI trenches 22 by conventional methods.

A dielectric layer 32, such as a deposited layer of silicon dioxide, is formed over channel region 24 between STI trenches 22. Deposited as a crossing layer over the dielectric layer is conductive gate layer 30, for example, polycrystalline silicon (polysilicon). (Source 26 and drain 28 regions may be formed by conventional methods after deposition of gate layer 30.) With the important exception discussed further below, gate 30 is doped with an n- or p-type dopant to increase the conductivity of the gate layer and form the desired FET structure. Such doping may be by ion implantation or other conventional methods.

Figure 3:
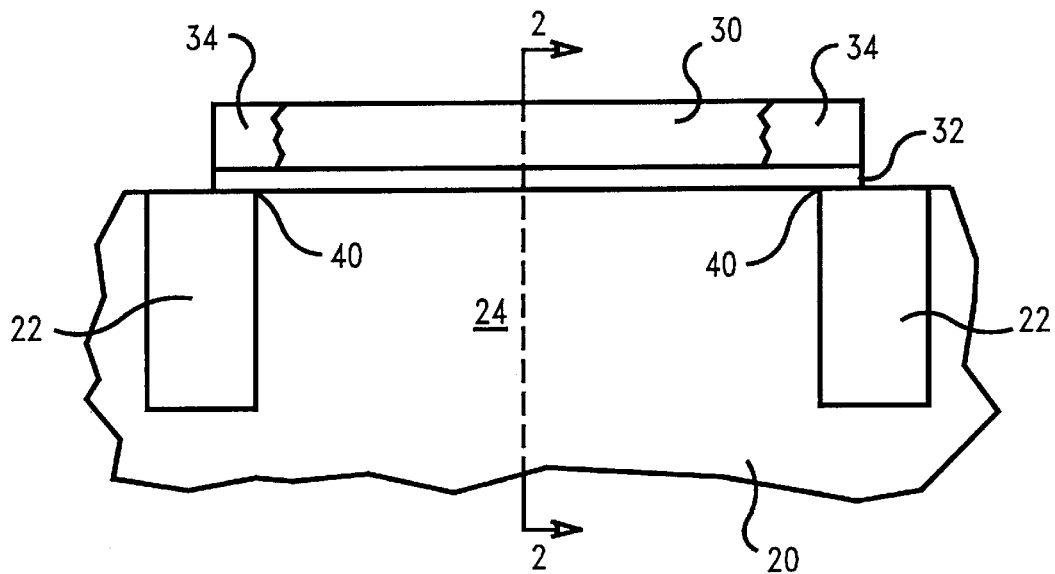
FIG. 3 is a vertical cross-sectional view of the field effect transistor of FIG. 1 across the width of the channel (line 3—3 of FIG. 1).

In FIG. 3, corner regions 40 in channel 24 are identified adjacent each of the STI regions 22. It is the change in threshold voltage in the channel associated with these corner regions 40, as compared to threshold voltage in the central portion of channel 24 below the planar portion of gate layer 30, which provide the undesired performance characteristics which the prior art and this invention seek to reduce or eliminate.

However, unlike the prior art methods of increasing the voltage threshold in corner regions 40, the present invention does not add additional structure but, instead, counterdopes the regions 34 of gate 30 above the corner regions to increase electrical resistivity thereof. These gate dopant-depleted regions 34 partially overlap both channel 24 and isolation trench 22 and extend along the entire thickness of gate 30 between source 26 and drain 28 regions.

For example, if gate layer 30 is doped with a p-type dopant as in a PFET, the regions 34 above corners 40 are counter doped with an n-type dopant. Similarly, if gate 30 is doped with an n-type dopant as in an NFET, the regions 34 are counter doped with a p-type dopant. Alternatively, regions 34 may be deliberately treated during doping of gate 30 so that the dopant does not diffuse into that region. To effect such treatment, there is preferably provided during processing an additional mask, which mask shields all but regions 34. Additionally, after masking, regions 34 can be counter doped to the dopant used in the remainder of gate conductor layer 30.

Figure 4:
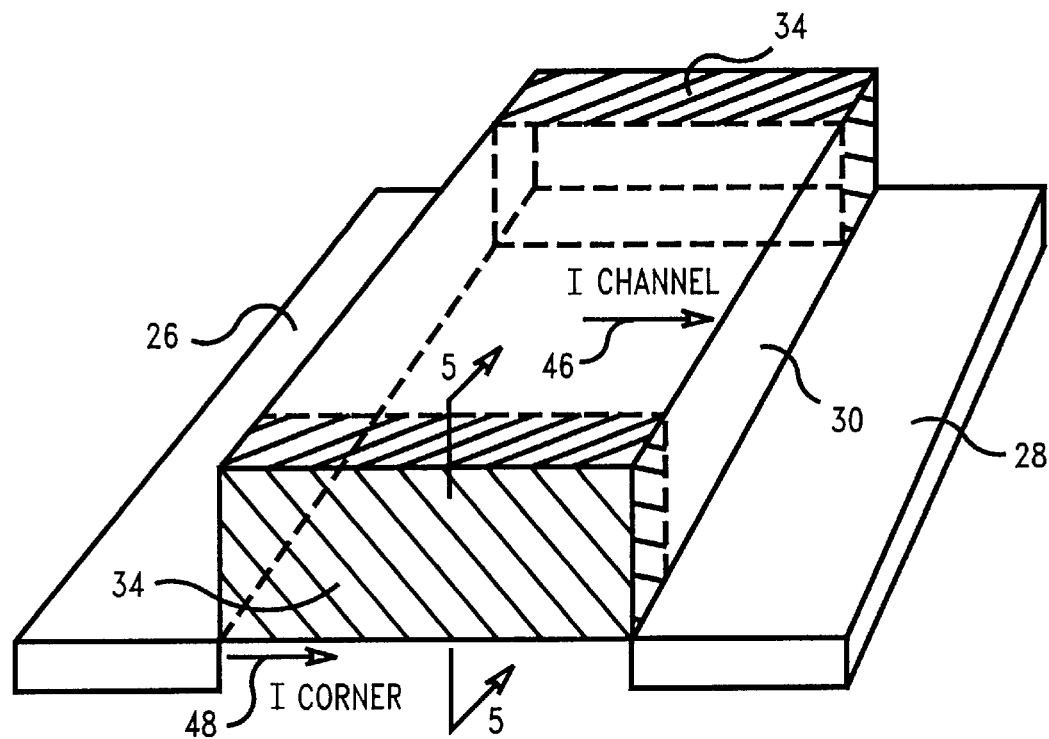
FIG. 4 is a perspective view, partially in vertical cross-section, of the field effect transistor of FIG. 1.
Figure 5:
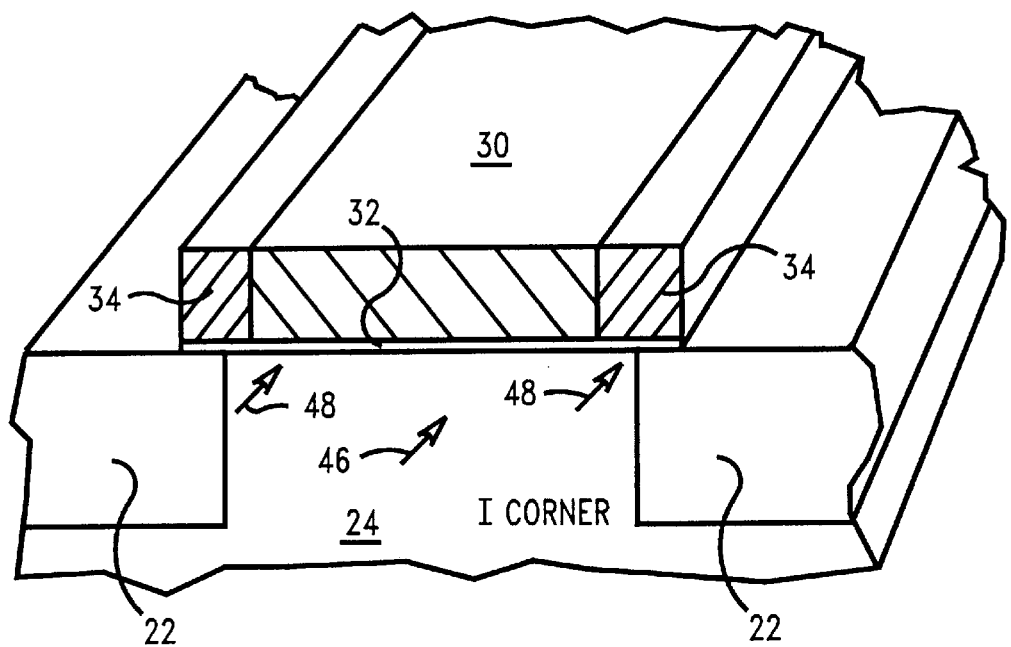
FIG. 5 is a perspective view, partially in vertical cross-section, of the field effect transistor of FIG. 1 (line 5—5 of FIG. 4).

Both methods cause polydepletion in regions 34 of the dopant used in the remaining planar portions of the gate layer 30 between the STI structures. Current flow through channel 24 is depicted in FIGS. 4 and 5, where corner device current flow is shown by arrows 48 and channel current flow is shown by arrow 46. Dopant depletion in regions 34 increases the inversion thickness of the gate dielectric ($T_{ox}$) therein, thereby causing an increase in the threshold voltage in the so-called corner devices of regions 40 above the threshold voltage of the FET.

Typically, doping concentration in planar gate layer 30 between regions 34 is approximately 1 to $10 \times 10^{15}$ atoms/cm$^2$. If counterdoped to the n- or p-type dopant, typical doping concentration in regions 34 is approximately 1 to $5 \times 10^{14}$ atoms/cm$^2$.

Figure 6:
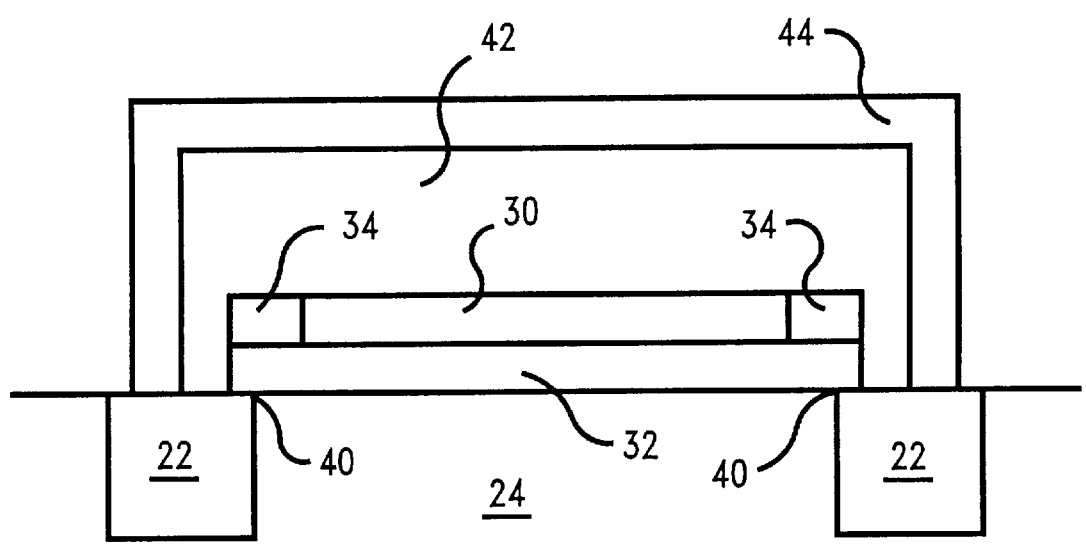
FIG. 6 is a vertical cross sectional view, similar to the view of FIG. 3, across the width of the channel of another preferred embodiment of a field effect transistor made in accordance with the present invention.

FIG. 6 shows an alternate embodiment of the FET produced in accordance with the present invention. After producing the doped gate 30 and counterdoped gate regions 34, a self-aligned metal silicide layer 42 such as $TiSi_2$, $CoSi_2$ or $WSi_2$ is formed over polysilicon layer 30 to complete the gate. The metal silicide layer 42 wraps around polysilicon layer 30 and depleted regions 34 to STIs 22. This structure results in a dopant depleted region which extends only partially from dielectric layer 32 to the upper portion of the gate. Optionally, an oxide cap layer 44 may be deposited to reduce dopant loss in the FET gate.

Figure 7:
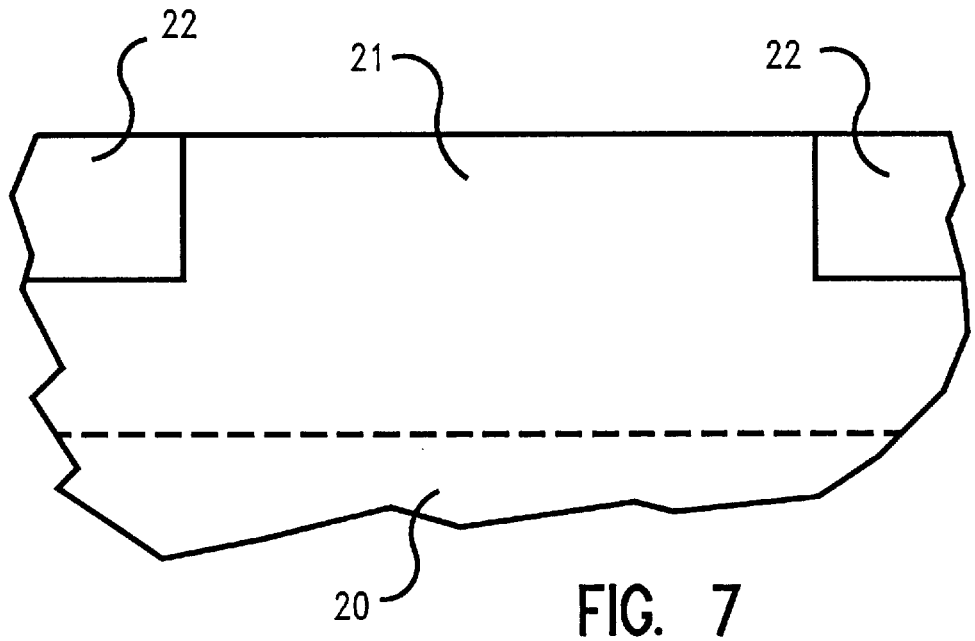
FIG. 7 is a vertical cross sectional view along the length of the channel of substrate and isolation regions in an initial step for making the field effect transistor of the present invention.

Preferred methods of manufacturing the semiconductor structure of the present invention are shown in FIGS. 7–15. In FIG. 7, a silicon substrate has formed thereon an epitaxy growth layer 21 which, along with the original substrate, will be collectively referred to as the substrate. A p minus substrate may or may not have the epitaxy growth, while a p plus substrate should have a p minus epitaxy growth. Isolation trenches 22 are conventionally formed after depositing an isolation mask on the substrate surface with an unmasked area which forms a rectangle or other desired outline, etching the unmasked area to form trenches, and depositing in the trenches a dielectric such as silicon dioxide to form the STI structure. A well or tub implant may be made before or after the STI formation by doping an n-well or p-well, depending on the type of device desired, below the STI level.

Figure 8:
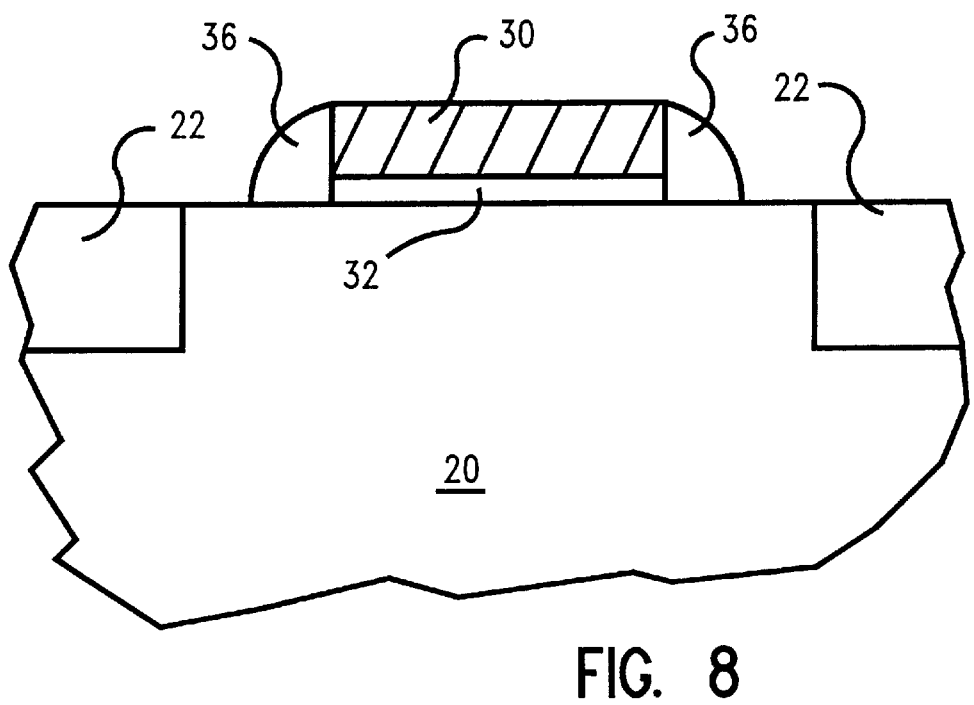
FIG. 8 is a vertical cross sectional view along the length of the channel showing the deposition of the dielectric spacer and gate on the substrate and isolation regions for making the field effect transistor of the present invention.

In FIG. 8, a dielectric layer 32 is deposited, subsequently, a polysilicon gate layer 30 is deposited over the dielectric layer, masked and etched, and then spacers 36 are formed on either side of the gate layer from an insulator such as silicon dioxide or silicon nitride.

Figure 9:
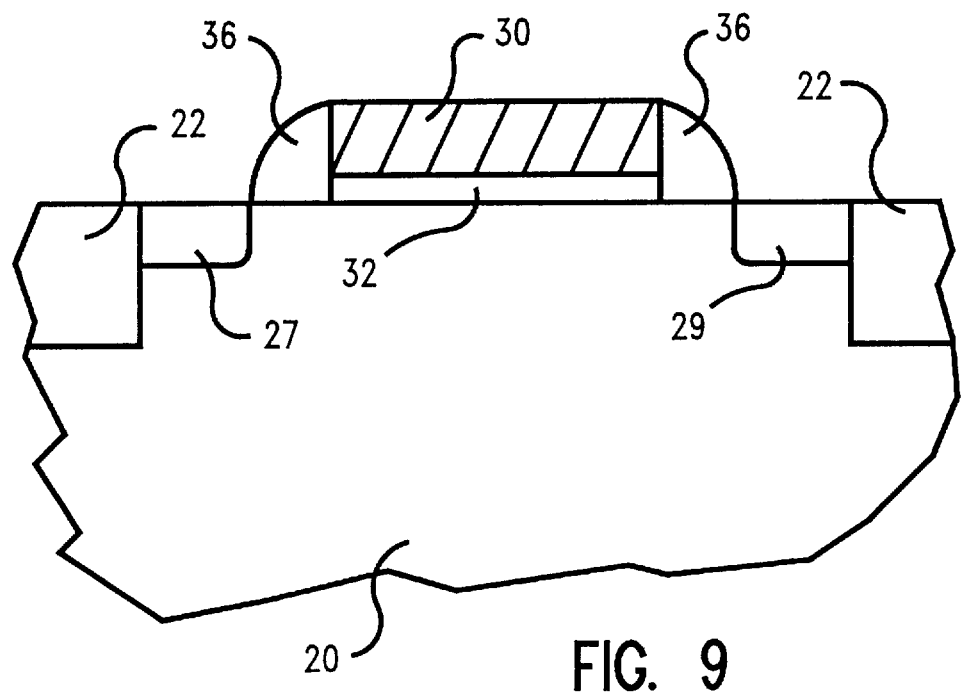
FIG. 9 is a vertical cross sectional view along the length of the channel showing the extension implant on the substrate for making the field effect transistor of the present invention.
Figure 10:
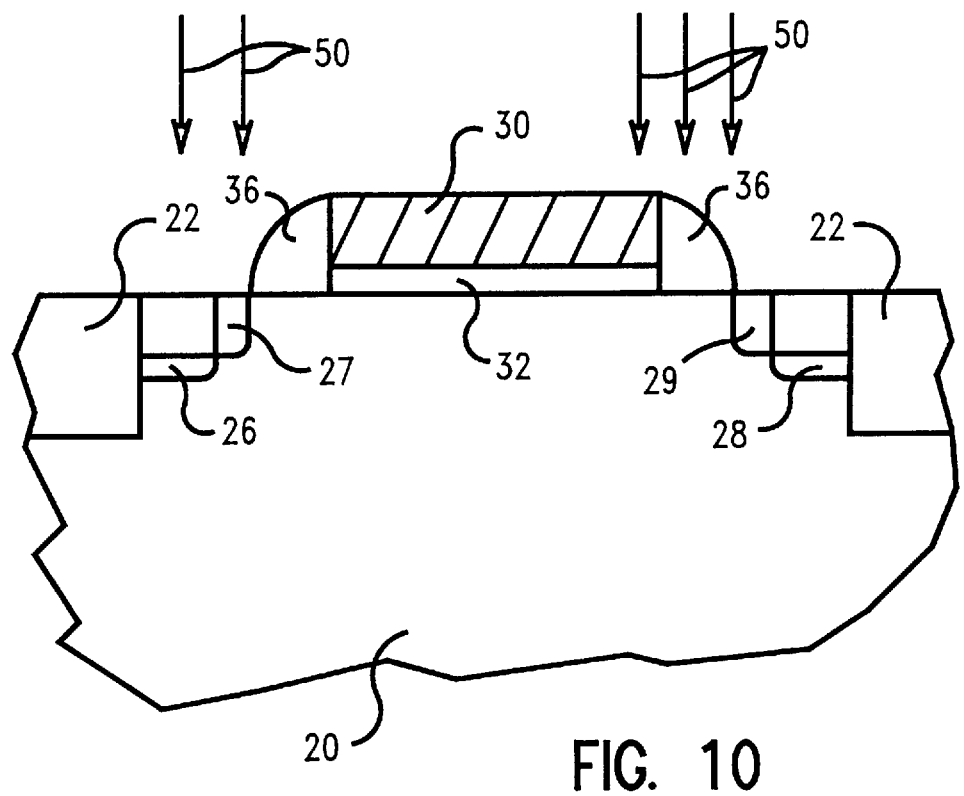
FIG. 10 is a vertical cross sectional view along the length of the channel showing the source and drain region implant on the substrate between isolation regions for making the field effect transistor of the present invention.
Figure 11:
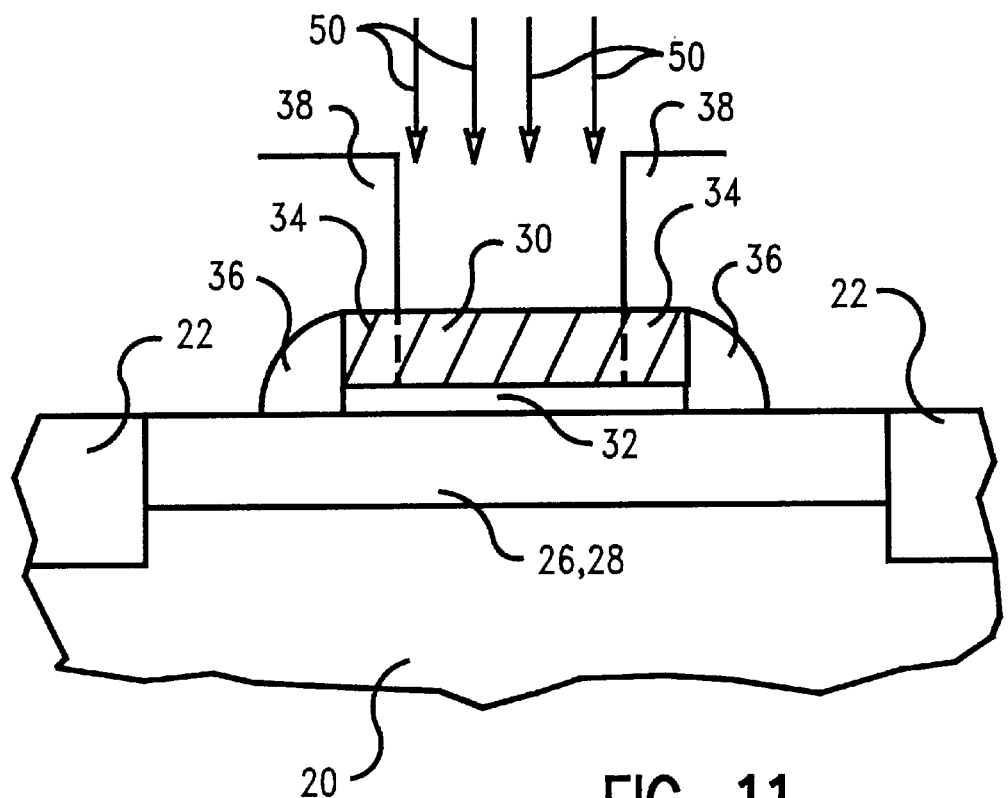
FIG. 11 is a vertical cross sectional view across the width of the channel showing the block mask for the source and drain region implant on the substrate between isolation regions for making the field effect transistor of the present invention.

In a first embodiment of the method of the present invention, FIGS. 9, 10 and 11 show a method of polysilicon edge depletion using blocked source/drain implants. In FIG. 9, extension implants 27, 29 comprise low doped transistor implants for the source and drain, respectively. These extension implants are closer to the gate 30 and dielectric 32 than the subsequent source 26 and drain 28 implant regions formed in FIGS. 10 and 11. The source/drain extension implants are formed at lower energy and dose levels than the source/drain implants, which extend deeper into the substrate. Extension implants 27, 29 overlap with the subsequent source and drain implants 26, 28 and may extend under the gate and dielectric layers somewhat. As shown in FIG. 11, the formation of the source and drain implants 26, 28 is made after forming a mask layer 38 which exposes the central portion of the surface of gate layer 30, but shields the edge regions. Mask 38 blocks the implant of n- or p-type dopants 50 from the corner regions of the gate, forming dopant-depleted regions 34, during the implanting of the source 26 and drain 28 regions. After doping, the mask is removed and a refractory metal layer may be overlaid on the gate layer, and the structure may be further conventionally processed to form interlevel dielectrics and metal interconnect deposition.

Figure 12:
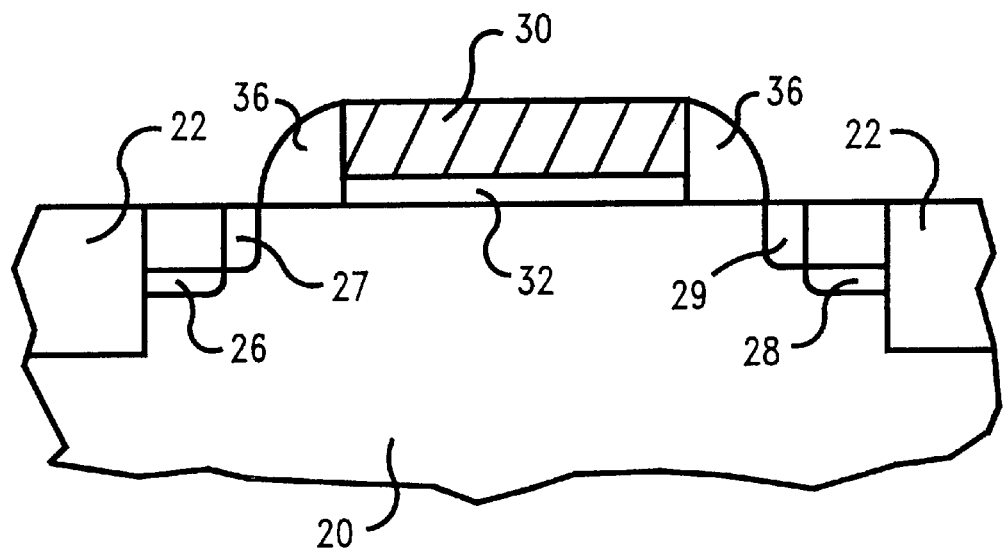
FIG. 12 is a vertical cross sectional view along the length of the channel showing an alternate embodiment of the FIGS. 9 and 10 extension, source and drain implant on the substrate for making the field effect transistor of the present invention.
Figure 13:
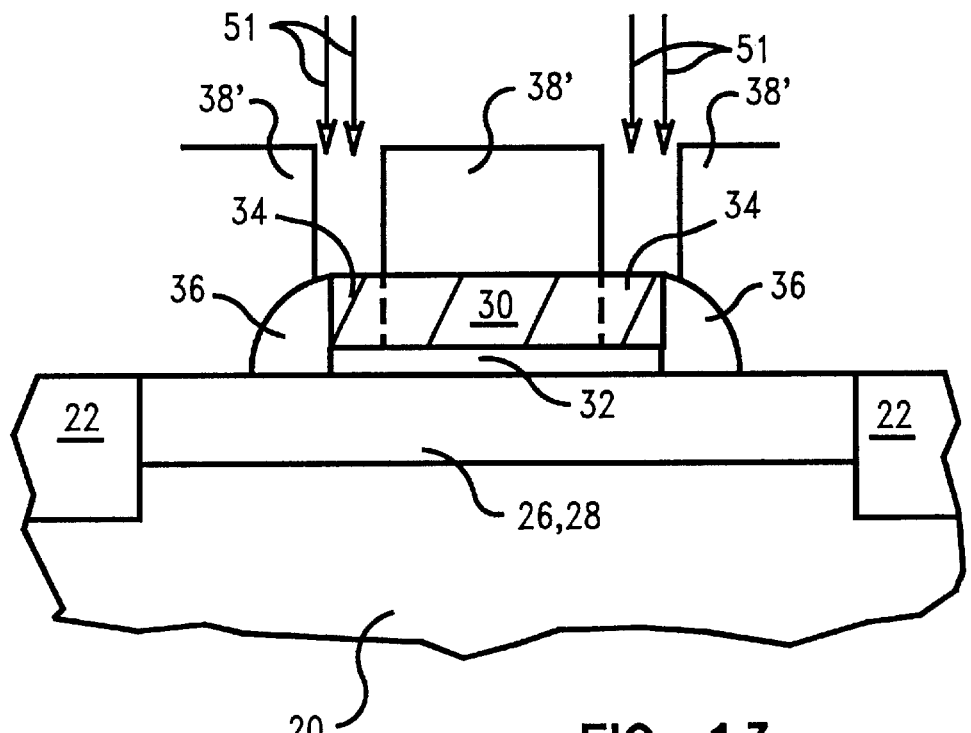
FIG. 13 is a vertical cross sectional view across the width of the channel showing a counterdoping implant mask for a complimentary source and drain region implant on the substrate for making the field effect transistor of the present invention.

In a second embodiment of the method shown in FIGS. 12 and 13, the method uses complimentary source/drain implants to counterdope the corner regions of the gate. Extension regions 27 and 29 are otherwise conventionally formed (FIG. 12) using low energy and dose n- or p- type implants. In an NFET device, hereafter the deeper source and drain regions and gate 30 are simultaneously doped throughout with an n-type dopant. A p-type source drain mask 38' is then applied over the source and drain regions and the entire upper surface of the gate and isolation structures, except for the opposite gate 30 edges and portions of the spacers 34, which remain unmasked (FIG. 13). A p-type dopant 51 is then implanted into the gate corner region to produce regions 34 which are counterdoped to the n-type dopant in the remainder of the gate layer 30. Processing then may continue as described previously. In a PFET device, the dopants described previously are reversed.

Figure 14:
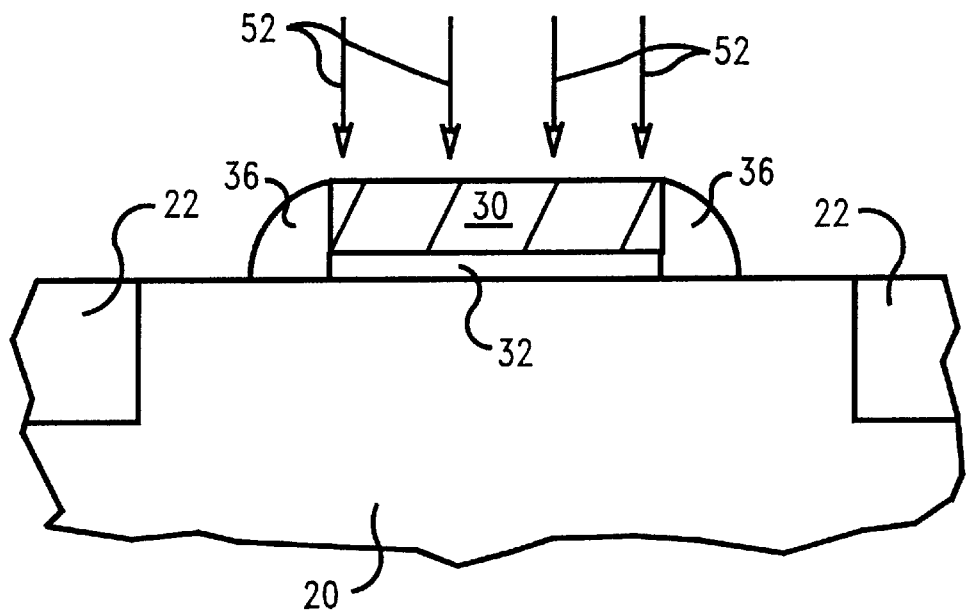
FIG. 14 is a vertical cross sectional view along the length of the channel showing an alternate embodiment of the FIGS. 9 and 10 extension implant on the substrate for making the field effect transistor of the present invention.
Figure 15:
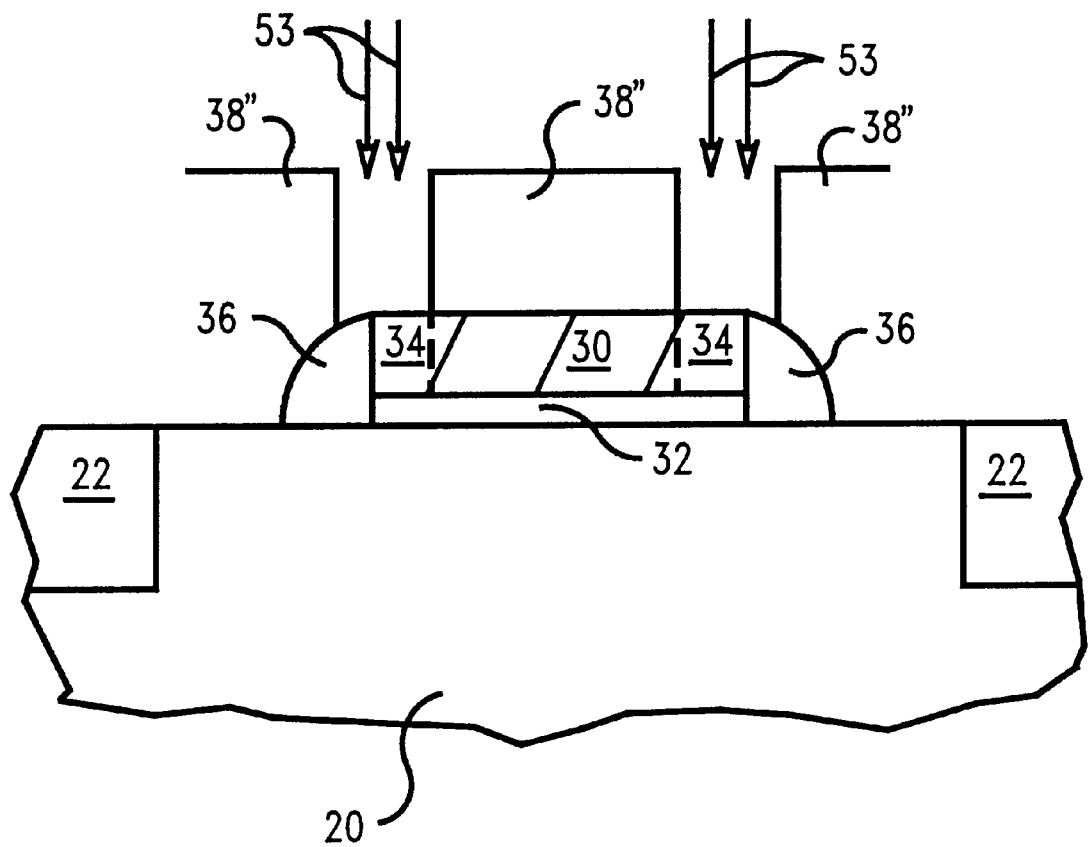
FIG. 15 is a vertical cross sectional view across the width of the channel showing a counterdoping implant mask for a complimentary extension implant on the substrate for making the field effect transistor of the present invention.

A third embodiment of the method of the present invention is shown in FIGS. 14 and 15, in which the method uses complimentary extension implants to counterdope the corner regions near the gate edges. In an NFET device, an n-type dopant 52 is implanted at low energy and dose levels in the source and drain extension regions and also throughout the gate layer 30, as shown in FIG. 14. Thereafter, a p-type source drain mask 38" is then applied over the source and drain extension regions and also over the entire upper surface of the gate and isolation structures, except for the drain extension region and the opposite gate 30 edges and portions of the spacers 34, which remain unmasked (FIG. 15). A p-type dopant 51 is then implanted into the gate edges to produce gate regions 34 which are counterdoped to the n-type dopant in the remainder of the gate layer 30. The n-type dopant is applied to form the source and drain regions 26, 28, without further affecting the gate 30 and counterdoped corner regions 34. Processing then may continue as described previously. In a PFET device, the dopants described previously are reversed.

A test was run on NFET and PFET MOSFETS made in accordance with the teachings of the present invention and under the conditions shown in Table 1 below.

TABLE 1

| # wafs | NFET S/D (source/drain) | PFET S/D (source/drain) | Nwell |
|---|---|---|---|
| (5) | POR (NSD0) | POR (PSD0) | POR (NW0) |
| (4) | NSD1 | POR | POR |
| (4) | NSD2 | POR | POR |
| (4) | POR | PSD1 | POR |
| (4) | POR | PSD2 | POR |
| (4) | POR | POR | NW1 |
| NSD0 (POR) P/15K/5E15 | | NSD1 P/20K/1E15 | NSD2 P/20K/5E14 |
| PSD0 (POR) B/10K/3.5E15 | | PSD1 B/10K/1E15 | PSD2 B/10K/5E14 |

POR designates the process of record. P and B designate phosphorous and boron implants, respectively. The implant energy (KeV) and implant dose levels are given alongside the implant element.

Table 2 below shows the resulting NFET data from this test. As can be seen, $T_{ox}$ (oxide thickness) inversion increased by 29%, $V_{tlin}$ (linear region threshold voltage) 10×10 increased by 11% and $V_{tsat}$ (saturated region threshold voltage) 10×0.25 increased by 29% when using the depleted regions in the splits listed for the NFET made in accordance with the present invention.

TABLE 2

| | NFET Parameters | | | | | | | |
|---|---|---|---|---|---|---|---|---|
| Test | Split 0 | Split 1 | Split 2 | Split 3 | Split 4 | Split 5 | Target | Unit |
| FETMOD 10 × 0.25 L eff (effective channel length) | 0.15864 | 0.14599 | 0.14447 | 0.15585 | 0.16048 | 0.16018 | 0.15 | um |
| FETMOD 10 × 0.25 Delt- W | −0.044155 | −0.056915 | −0.05844 | −0.04015 | −0.042605 | −0.05051 | 0.13 | um |
| FETMOD 10 × 10 Vtlin Ex | 0.352645 | 0.380925 | 0.38912 | 0.35335 | 0.354855 | 0.352055 | 0.36 | V |
| FETMOD 10 × 0.25 VtSat | 0.16327 | 0.20331 | 0.21195 | 0.13999 | 0.18013 | 0.179625 | 0.375 | V |
| FETMOD 10 × 0.25 Idsat (saturated drain current) | 727.3 | 611.05 | 590.475 | 748.88 | 711.06 | 704.33 | 545 | uA/um |
| QEFETTDL1 10 × 0.25 Idsat (saturated drain current) | 711.09 | 595.4 | 587.075 | 752.2 | 693.19 | 695.19 | 545 | uA/um |
| QNFETDL1 10 × 0.25 Ioff (off current) | 13.133 | 5.287 | 4.886 | 35.597 | 7.7776 | 6.4051 | 0.245 | nA/um |
| FETMOD 10 × 0.25 Series R | 83.7555 | 148.09 | 172.52 | 77.21 | 91.3445 | 90.405 | 250 | ohm-um |
| DEVARES 38116 X1 Tox Phys | 39.155 | 37.821 | 37.784 | 39.289 | 39.226 | 39.191 | 39 | Ang |
| PARM 1FE 88 × 90 Tox Inv | 48.398 | 61.544 | 62.8435 | 48.411 | 48.32 | 48.437 | 47.5 | Ang |
| PARM1FE 90 × 135 Cj Area (junction capacitance | 1.3359 | 1.5142 | 1.61975 | 1.3635 | 1.34975 | 1.35225 | 1.28 | ff/um 2 |

TABLE 2-continued

| | NFET Parameters | | | | | | | |
|---|---|---|---|---|---|---|---|---|
| Test | Split 0 | Split 1 | Split 2 | Split 3 | Split 4 | Split 5 | Target | Unit |
| PARM1FE 47637 x0.25 C O Lap (overlap capacitance) | 0.4849 | 0.44871 | 0.44614 | 0.4801 | 0.48394 | 0.48237 | 0.37 | ff/um |

Table 3 below shows the resulting PFET data from this test. As can be seen, $T_{ox}$ inversion increased by 50%, Vtlin 10×10 increased by 47% and Vtsat 10×0.25 increased by 64% when using the depleted regions in the splits listed for the PFET made in accordance with the present invention.

TABLE 3

| | PFET Parameters | | | | | | | |
|---|---|---|---|---|---|---|---|---|
| Test | Split 0 | Split 1 | Split 2 | Split 3 | Split 4 | Split 5 | Target | Unit |
| FETMOD 10 × 0.25 L eff (effective channel length) | 0.179915 | 0.1773 | 0.176545 | 0.19472 | 0.2864 | 0.18651 | 0.17 | um |
| PARM1FE 10 × 0.25 Cap LWB | 0.19093 | 0.18619 | 0.186805 | 0.20803 | 0.172535 | 0.19585 | 0 | um |
| FETMOD 10 × 0.25 Delt- W | −0.1085 | −0.1124 | −0.10514 | −0.09699 | −0.107785 | −0.095895 | 0.06 | um |
| FETMOD 10 × 10 Vtlin Ex | 0.360865 | 0.360135 | 0.359575 | 0.42916 | 0.52686 | 0.345705 | 0.367 | V |
| FETMOD 10 × 0.25 Vtlin | 0.41645 | 0.41464 | 0.411485 | 0.53421 | 0.66922 | 0.39913 | 0 | V |
| FETMOD 10 × 0.25 Vt Sat | 0.35724 | 0.35502 | 0.351755 | 0.47432 | 0.59423 | 0.342635 | 0.335 | V |
| FETMOD 10 × 0.25 Idsat (saturated drain current) | 207.24 | 209.88 | 211.215 | 156.1 | 101.975 | 207.435 | 227 | u A/um |
| QNFETDL1 10 × 0.25 Ioff (off current) | 0.009205 | 0.01306 | 0.014185 | 0.01084 | 0.011565 | 0.023005 | 0.099 | u A/um |
| QNFETDL1 10 × 0.25 I NW | 0.06672 | 0.06725 | 0.07824 | 0.1057 | 0.088725 | 0.095025 | 0.3 | n A/um |
| QNFETDL1 10 × 0.25 Series R | 475.99 | 467.34 | 464.68 | 362.76 | −816.785 | 460.96 | 500 | ohm-um |
| DEVARES 38116 × 1 Tox Phys | 38.213 | 38.2805 | 38.319 | 38.06 | 37.7525 | 38.26 | 39 | Ang |
| PARM1FE 88 × 90 Tox Inv | 51.144 | 51.1585 | 51.144 | 60.362 | 76.921 | 51.144 | 48.7 | Ang |
| PARM1FE 90 × 135 Cj Area (junction capacitance | 1.4187 | 1.4137 | 1.41505 | 1.6123 | 1.7326 | 1.1223 | 1.49 | ff/um2 |
| PARM1FE 47637 x0.25 C O Lap (overlap capacitance) | 0.37494 | 0.37238 | 0.37206 | 0.32689 | 0.31648 | 0.37686 | 0.37 | ff/um |

Figure 16:
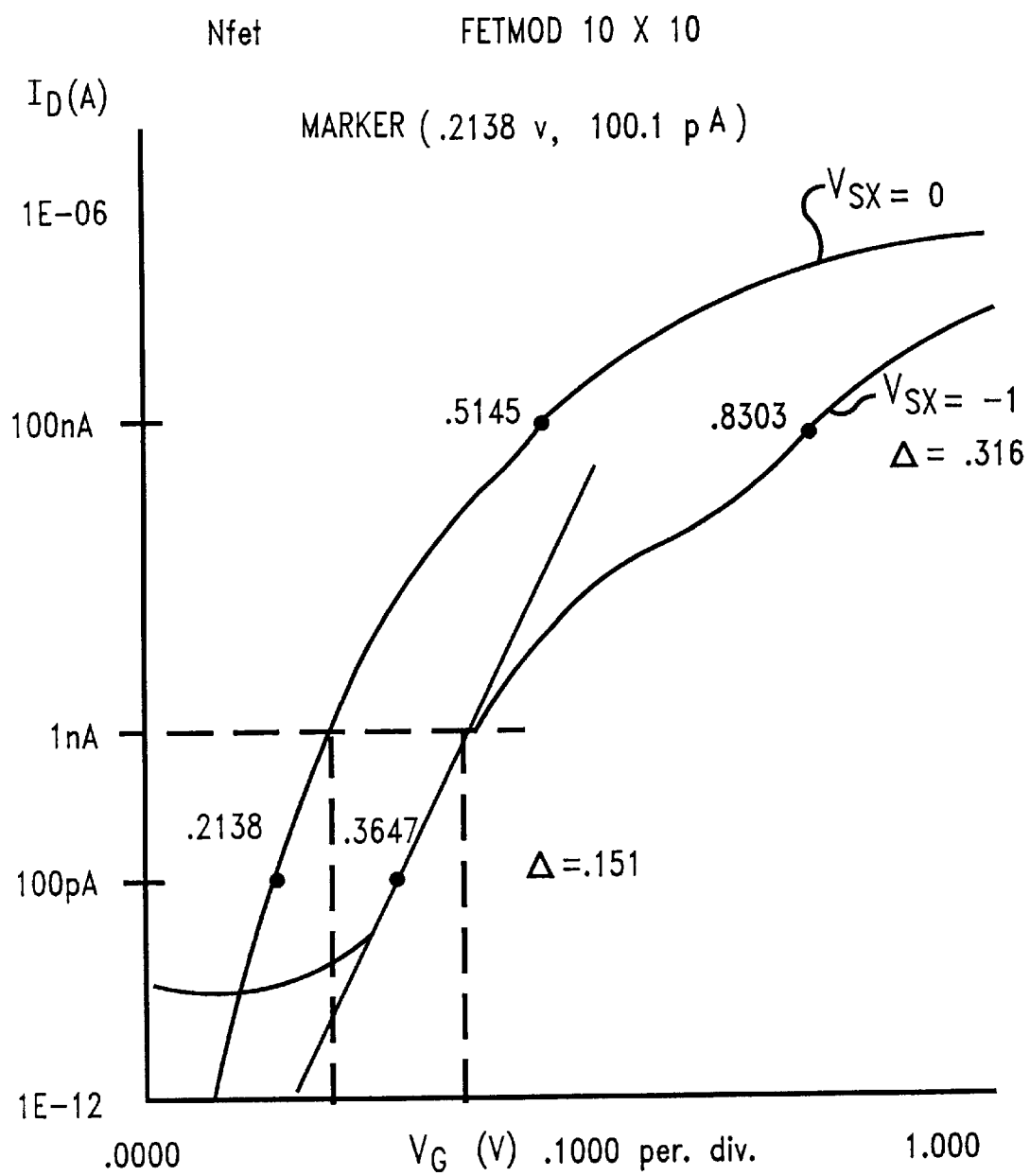
FIG. 16 is a graphical representation of MOSFET drain current $I_D$ versus gate voltage $V_G$ as a function of substrate back bias.

FIG. 16 graphically depicts the drain current ($I_D$)-gate voltage ($V_G$) characteristics of a corner device made by conventional techniques. The left curve is with VSX=0 while the right curve is with VSX=−1, with the latter showing the characteristic hump of the corner device. The present invention provides a means of eliminating the $I_D$-$V_G$ hump as shown.

Thus, the present invention provides a method and structure for increasing threshold voltage tolerance at FET isolation corners. The structure has improved edge dielectric breakdown and lower MOSFET gate-induced drain leakage (GIDL). The dopant depleted regions above the channel/isolation corner effectively increases the oxide thickness above the corner device and increases the inversion $T_{ox}$.

Because the present invention does not add additional structure or thickness, it reduces the complexity of prior manufacturing methods for increasing threshold voltage in a corner device and may be fabricated with improved reliability and fewer performance problems. Because of the reduction and/or elimination of premature FET turn-on characteristics in the corner region, the modeling of field effect transistors may be made simpler and more reliable.

Moreover, the present invention provides a more voltage tolerant semiconductor structure which may be used for mixed-voltage peripheral input/output circuitry, analog applications and ESD network applications. Such structure is also more tolerant to EOS and ESD.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a field effect transistor semiconductor structure comprising the steps of:
   a) providing a semiconductor substrate;
   b) forming isolation regions in said substrate to define a channel region;
   c) forming a gate over said channel and isolation regions;
   d) masking portions of said gate over regions of interface between the channel and the isolation regions to prevent dopant from being diffused therein;
   e) introducing into said gate a dopant to increase the electrical conductivity thereof between said isolation regions except for the portions of said gate over regions of interface between said channel and said isolation regions; and
   f) forming a finished field effect transistor having gate regions having lower concentration of the dopant over the regions of interface between said channel and said isolation regions.

2. The method of claim 1 further including the steps of:
   i) forming a dielectric layer over said channel region prior to forming said gate; and
   ii) forming source and drain regions in said substrate between said isolation regions on either side of said channel region.

3. A method of making a field effect transistor semiconductor structure comprising the steps of:
   a) providing a semiconductor substrate;
   b) forming isolation regions in said substrate to define a channel region;
   c) forming a gate over said channel and isolation regions, said gate containing a dopant to increase the electrical conductivity thereof between said isolation regions; and
   d) counterdoping said gate over regions of interface between said channel and said isolation regions without changing the conductivity type to decrease the electrical conductivity compared to portions of the gate between the interface regions.

4. A method of making a semiconductor structure comprising the steps of:
   a) providing a semiconductor structure having a substrate, a channel region in said substrate, isolation regions formed in said substrate on opposite sides of said channel region, said isolation regions defining corner regions of said channel along interfaces between said channel and isolation regions, a dielectric layer over said channel region between said isolation regions, and a gate conductor layer having an n- or p-type dopant over said dielectric layer between said isolation regions; and
   b) depleting portions of said gate conductor layer above said corner regions of said n- or p-type dopant without changing the conductivity type, wherein the depleted portions of the gate conductor display increased resistivity compared to the remaining portions of the gate conductor layer over said channel region.

5. The method of claim 4 wherein said step of depleting is by masking said portions of said gate conductor layer above said corner regions to restrict diffusion of said dopant.

6. The method of claim 4 wherein said step of depleting is by counterdoping said portions of said gate conductor layer above said corner regions.

7. The method of claim 4 further including the step of forming extension implants in said substrate within said isolation regions and on either side of said gate, and wherein said step of depleting is by counterdoping said portions of said gate conductor layer above said corner regions after forming said extension implants.

8. The method of claim 4 further including the step of forming source and drain implants in said substrate within said isolation regions and on either side of said gate, and wherein said step of depleting is by counterdoping said portions of said gate conductor layer above said corner regions after forming said source and drain implants.

9. The method of claim 3 wherein said dopant in said gate is a p-type dopant and in step (d) said regions of interface are counterdoped with an n-type dopant.

10. The method of claim 3 wherein said dopant in said gate is an n-type dopant and in step (d) said regions of interface are counterdoped with a p-type dopant.

11. The method of claim 6 wherein said dopant in said gate conductor layer is a p-type dopant and said portions of said gate conductor layer above said corner regions are counterdoped with an n-type dopant.

12. The method of claim 6 wherein said dopant in said gate conductor layer is an n-type dopant and said portions of said gate conductor layer above said corner regions are counterdoped with a p-type dopant.

13. The method of claim 7 wherein said dopant in said gate conductor layer is a p-type dopant and said portions of said gate conductor layer above said corner regions are counterdoped with an n-type dopant.

14. The method of claim 7 wherein said dopant in said gate conductor layer is an n-type dopant and said portions of said gate conductor layer above said corner regions are counterdoped with a p-type dopant.

15. The method of claim 8 wherein said dopant in said gate conductor layer is a p-type dopant and said portions of said gate conductor layer above said corner regions are counterdoped with an n-type dopant.

16. The method of claim 8 wherein said dopant in said gate conductor layer is an n-type dopant and said portions of said gate conductor layer above said corner regions are counterdoped with a p-type dopant.

17. The method of claim 4 wherein in step (b) the depleted portions of the gate conductor extend from the dielectric layer to the upper surface of said gate.

18. The method of claim 4 wherein said gate conductor layer comprises a layer of silicon containing said dopant and the dopant-depleted regions and further including the step of adding a metal silicide layer over said silicon layer, including the dopant-depleted regions.

19. The method of claim 4 wherein the step of depleting is by counterdoping said portions of said gate conductor layer above said corner regions such that the counterdoped portions overlap at least said channel region and said isolation regions.

20. A method of making a field effect transistor semiconductor structure comprising the steps of:

a) providing a semiconductor substrate;

b) forming isolation regions in said substrate to define a channel region;

c) forming a dielectric layer over said channel region;

d) forming a gate over said channel and isolation regions;

e) masking portions of said gate over regions of interface between the channel and the isolation regions to prevent dopant from being diffused therein;

f) introducing into said gate a dopant to increase the electrical conductivity thereof between said isolation regions except for the portions of said gate over regions of interface between said channel and said isolation regions;

g) forming source and drain regions in said substrate between said isolation regions on either side of said channel region; and h) forming a finished field effect transistor having gate regions having lower concentration of the dopant over the regions of interface between said channel and said isolation regions to decrease the electrical conductivity compared to portions of the gate between the interface regions, wherein voltage thresholds of the channel corner regions beneath depleted portions of the gate are increased compared to regions of the channel between the corner regions, said field effect transistor having reduced premature FET turn-on characteristics in said channel corner regions.

* * * * *